(12) United States Patent
Thrush et al.

(10) Patent No.: US 10,236,681 B2
(45) Date of Patent: Mar. 19, 2019

(54) POWER CABLE ASSEMBLY HAVING A CIRCUIT PROTECTION DEVICE

(71) Applicant: TYCO ELECTRONICS CORPORATION, Berwyn, PA (US)

(72) Inventors: Roger Lee Thrush, Clemmons, NC (US); Sean Delaney O'Brien, Kernersville, NC (US); Thomas Michael Banas, Kernersville, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 252 days.

(21) Appl. No.: 15/265,989

(22) Filed: Sep. 15, 2016

(65) Prior Publication Data

US 2018/0076616 A1  Mar. 15, 2018

(51) Int. Cl.
| | |
|---|---|
| *H02H 7/26* | (2006.01) |
| *B60L 11/18* | (2006.01) |
| *G01R 31/02* | (2006.01) |
| *H01F 38/32* | (2006.01) |
| *H01H 47/22* | (2006.01) |
| *H05K 5/02* | (2006.01) |
| *H01H 9/02* | (2006.01) |
| *H01H 83/04* | (2006.01) |
| *H01H 83/14* | (2006.01) |

(52) U.S. Cl.
CPC ............ *H02H 7/26* (2013.01); *B60L 11/1818* (2013.01); *G01R 31/025* (2013.01); *H01F 38/32* (2013.01); *H01H 9/0228* (2013.01); *H01H 47/223* (2013.01); *H01H 83/04* (2013.01); *H01H 83/144* (2013.01); *H05K 5/0247* (2013.01); *B60L 2230/12* (2013.01)

(58) Field of Classification Search
CPC ............................. H02H 7/26; B60L 11/1818
See application file for complete search history.

(56) References Cited

U.S. PATENT DOCUMENTS

| | | | |
|---|---|---|---|
| 5,864,455 A | 1/1999 | Gernhardt et al. | |
| 5,943,199 A | 8/1999 | Aromin | |
| 7,253,629 B1 * | 8/2007 | Richards | G01R 31/3277 324/424 |
| 9,007,186 B1 * | 4/2015 | Krummey | G06Q 50/06 340/12.32 |
| 2011/0172839 A1 * | 7/2011 | Brown | B60L 3/0069 700/292 |

FOREIGN PATENT DOCUMENTS

EP    2338723 A2    6/2011

OTHER PUBLICATIONS

European Search Report, European Application No. 17191009.4, European Filing Date, Jan. 24, 2018.

* cited by examiner

*Primary Examiner* — Scott Bauer

(57) ABSTRACT

A power cable assembly includes a power cable extending between a first end and a second end having a hot conductor and a neutral conductor. The power cable assembly includes a circuit protection device along the power cable between the first and second ends. The circuit protection device has a ground fault circuit interrupt (GFCI) device configured to sense a current difference on the hot and neutral conductors to initiate a triggering event. The circuit protection device has a high-power relay device connected to the GFCI device. The high-power relay device is connected to the hot conductor and is configured to open the hot line when the triggering event is initiated by the GFCI device.

20 Claims, 2 Drawing Sheets

POWER CABLE ASSEMBLY HAVING A CIRCUIT PROTECTION DEVICE

BACKGROUND OF THE INVENTION

The subject matter herein relates generally to power cable assemblies.

Power cables are used for many applications, including charging of electric vehicles. Power cables typically supply high voltage for power components, such as a charging device. As such, the power cables incorporate safety features to prevent electric shock in case of failure or misuse. For example, some known power cables incorporate a ground fault circuit interrupt (GFCI) circuit in the power cable. The GFCI circuit cuts power in the case of excess current flowing from the "hot" line through the ground instead of through the "neutral" line. However conventional power cables having GFCI circuits are unable to withstand high short circuit currents. The GFCI circuits of conventional power cables fail when used in high power applications, such as those used in electric vehicle charging devices. For example, the circuits may have problems with arcing, which may damage the circuits.

A need remains for a power cable capable of withstanding high power short circuit conditions.

BRIEF DESCRIPTION OF THE INVENTION

In one embodiment, a power cable assembly is provided including a power cable extending between a first end and a second end having a hot conductor and a neutral conductor. The power cable assembly includes a circuit protection device along the power cable between the first and second ends. The circuit protection device has a ground fault circuit interrupt (GFCI) device configured to sense a current difference on the hot and neutral conductors to initiate a triggering event. The circuit protection device has a high-power relay device connected to the GFCI device. The high-power relay device is connected to the hot conductor and is configured to open the hot line when the triggering event is initiated by the GFCI device.

In another embodiment, a power cable assembly is provided including a power cable extending between a first end and a second end having a hot conductor and a neutral conductor. The power cable assembly includes a circuit protection device along the power cable between the first and second ends. The circuit protection device has a ground fault circuit interrupt (GFCI) device configured to sense a current difference on the hot and neutral conductors to initiate a triggering event. The circuit protection device has a first high-power relay device connected to the GFCI device and a second high-power relay device connected to the GFCI device. The first high-power relay device is connected to the hot conductor and is configured to open the hot line when the triggering event is initiated by the GFCI device. The second high-power relay device is connected to the neutral conductor and is configured to open the neutral line when the triggering event is initiated by the GFCI device.

In a further embodiment, a power cable assembly is provided including a power cable extending between a first end and a second end having a hot conductor and a neutral conductor. The power cable assembly includes a circuit protection device along the power cable between the first and second ends. The circuit protection device has a housing attached to the power cable. The housing has an opening receiving the hot conductor and the neutral conductor. The circuit protection device has a ground fault circuit interrupt (GFCI) device in the housing. The GFCI device is configured to sense a current difference on the hot and neutral conductors to initiate a triggering event. The circuit protection device has a high-power relay device in the housing. The high-power relay device is connected to the GFCI device and is connected to the hot conductor and is configured to open the hot line when the triggering event is initiated by the GFCI device.

DETAILED DESCRIPTION OF THE INVENTION

Figure 1:
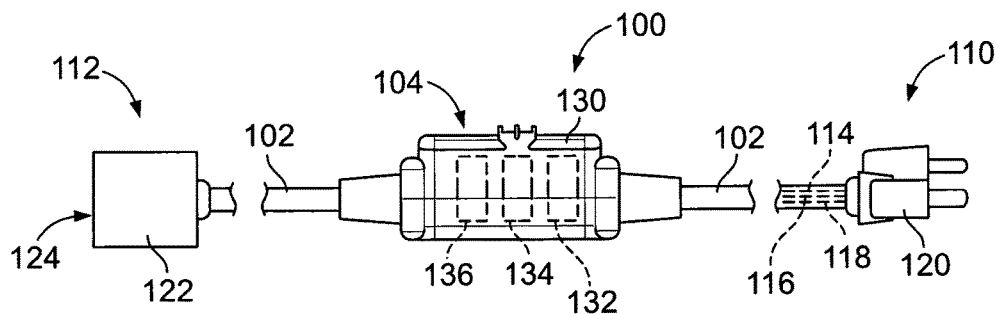
FIG. 1 illustrates a power cable assembly in accordance with an exemplary embodiment.
Figure 2:
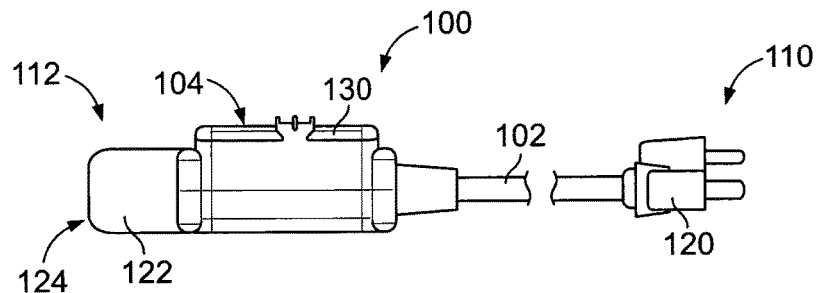
FIG. 2 illustrates the power cable assembly in accordance with another exemplary embodiment.

FIG. 1 illustrates a power cable assembly 100 in accordance with an exemplary embodiment. FIG. 2 illustrates the power cable assembly 100 in accordance with another exemplary embodiment. The power cable assembly 100 includes a power cable 102 and a circuit protection device 104 that is a safety feature for the power cable assembly 100. The circuit protection device 104 is provided along the power cable 102. The circuit protection device 104 is used to switch current in the system on and off quickly to protect the circuit. The circuit protection device 104 cuts power in the system if excess current is sensed, such as in a short circuit situation. The circuit protection device 104 may prevent electric shock in case of failure or misuse of the power cable assembly 100. In an exemplary embodiment, the circuit protection device 104 withstands very high short circuit currents to prevent failing or damage to the power cable assembly 100.

The power cable 102 extends between a first end 110 and a second end 112. The power cable assembly 100 includes a hot conductor 114, a neutral conductor 116 and a ground conductor 118 between the first and second ends 110, 112. The power cable assembly 100 includes a first connector 120 at the first end 110 and a second connector 122 at the second end 112.

FIG. 1 illustrates an embodiment having the circuit protection device 104 in-line with the power cable 102 between the first and second connectors 120, 122. For example, the circuit protection device 104 is remote from the first connector 120 and is remote from the second connector 122. A length of the power cable 102 is provided between the circuit protection device 104 and the first connector 120 and a length of the power cable 102 is provided between the circuit protection device 104 and the second connector 122. In contrast, the embodiment illustrated in FIG. 2 shows the circuit protection device 104 integrated with one of the connectors, such as the second connector 122. For example, the circuit protection device 104 and the second connector 122 have a common housing. In the embodiment shown in FIG. 2, no length of the power cable 102 is provided between the circuit protection device 104 and the second connector 122.

In an exemplary embodiment, the first connector 120 is a plug configured to be electrically connected to a wall outlet. The first connector 120 may be a standard three-prong plug. Other types of connectors may be provided at the first end 110 in alternative embodiments. Optionally, the first connector 120 may be integrated into a power source, such as directly into a building wiring system. The second connector 122 may be a socket or plug configured to be electrically connected to another component, such as to supply power to such component. For example, the second connector 122 may be a standard three-prong receptacle connector. In other various embodiments, the second connector 122 is a charging connector. For example, the second connector 122 may be a charging connector for an electric vehicle. The second connector 122 may have an electric vehicle charging interface 124 configured to be electrically connected to an electric vehicle for charging the electric vehicle. Other types of connectors may be provided in alternative embodiments.

In an exemplary embodiment, the circuit protection device 104 includes a housing 130 holding various components and/or circuits to define the circuit protection device 104. For example, in an exemplary embodiment, the circuit protection device 104 includes a ground fault circuit interrupt (GFCI) device 132 used to provide circuit protection. In an exemplary embodiment, the circuit protection device 104 includes a first high-power relay device 134 configured to provide circuit protection. In an exemplary embodiment, the circuit protection device 104 includes a second high-power relay device 136 configured to provide circuit protection. The circuit protection device 104 may include other circuit protection devices used to provide circuit protection for the power cable assembly 100.

In various embodiments, the first high-power relay device 134 may be connected to the hot conductor 114 while the second high-power relay device 136 is configured to be connected to the neutral conductor 116. The first high-power relay device 134 may open and close the hot line defined by the hot conductor(s) 114. The second high-power relay device 136 may be configured to open and close the neutral line defined by the neutral conductor(s) 116. Optionally, control of the high-power relay devices 134, 136 may be controlled by the GFCI device 132. In other various embodiments, control of the high-power relay devices 134, 136 may be controlled by other devices, such as a control circuit separate from the GFCI device 132.

In an exemplary embodiment, during operation, the GFCI device 132 is configured to sense a current difference on the hot and neutral conductors 114, 116 to initiate a triggering event when a differential current is sensed. When the triggering event is sensed, the GFCI device 132 may initiate a circuit protection mode. For example, the GFCI device 132 may cause the high-power relay devices 134, 136 to open when the triggering event is sensed.

Figure 3:
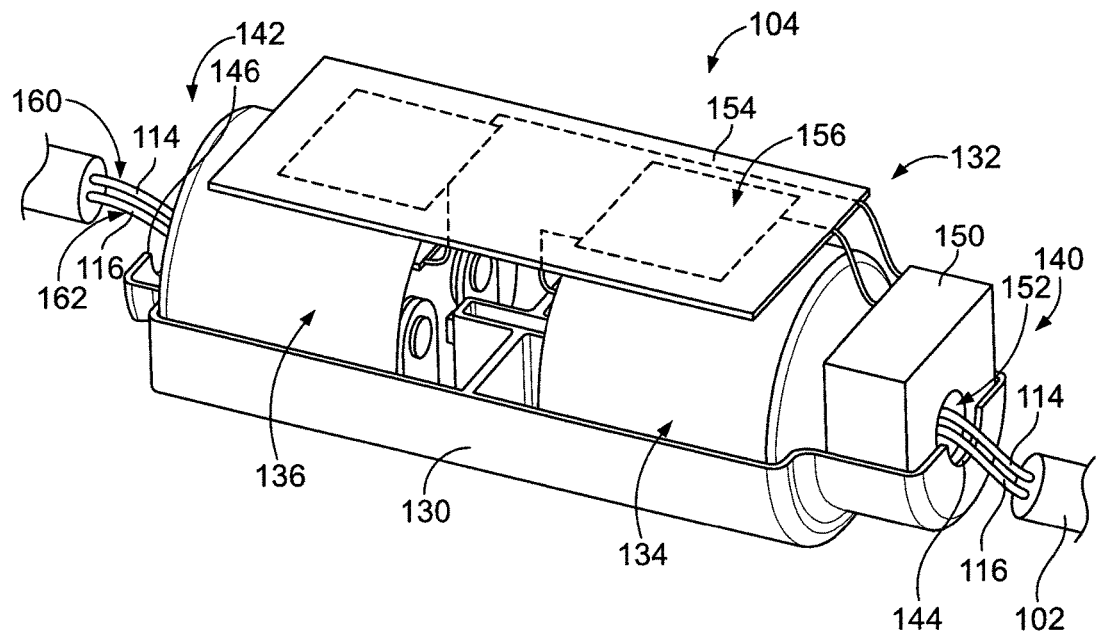
FIG. 3 is a partial-sectional view of a circuit protection device of the power cable assembly in accordance with an exemplary embodiment.
Figure 4:
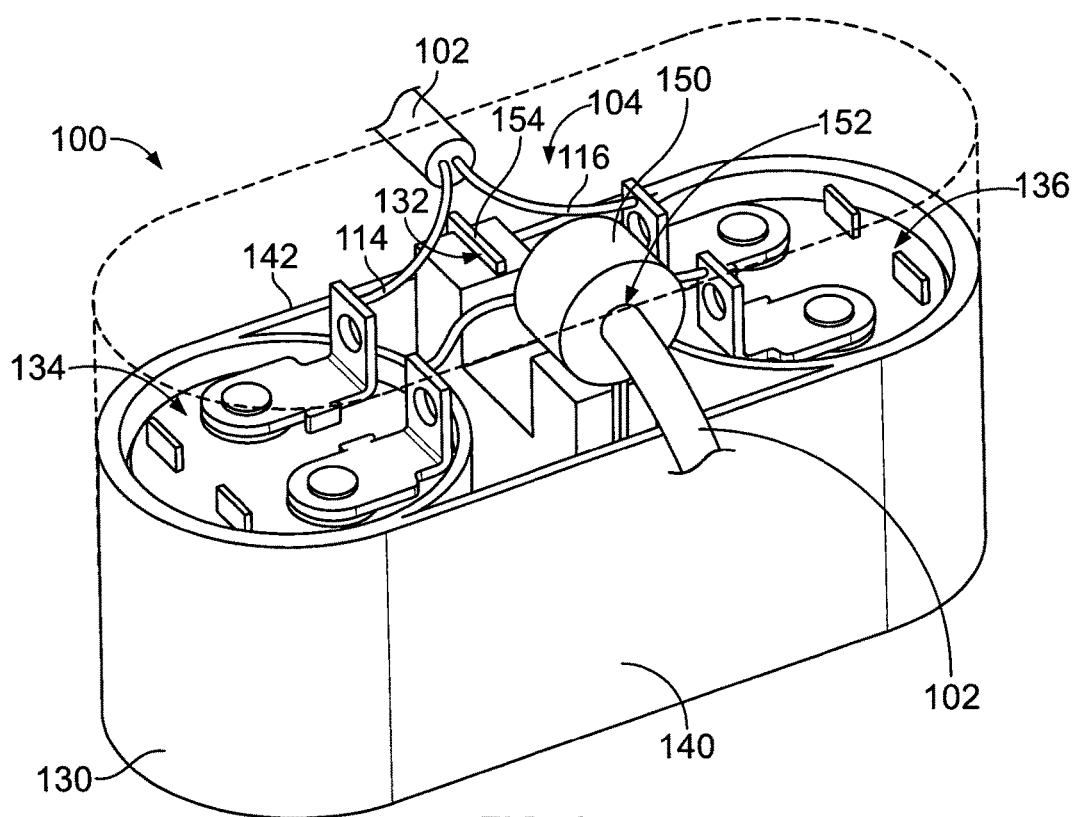
FIG. 4 is a partial-sectional view of the circuit protection device of the power cable assembly in accordance with an exemplary embodiment.

FIG. 3 is a partial-sectional view of the circuit protection device 104 in accordance with an exemplary embodiment. FIG. 4 is a partial-sectional view of the circuit protection device 104 in accordance with an exemplary embodiment. FIGS. 3 and 4 show the GFCI device 132 and high-power relay devices 134, 136 arranged within the housing 130. Portions of the housing 130 are removed to illustrate the GFCI device 132 and high-power relay devices 134, 136.

The embodiments shown in FIGS. 3 and 4 illustrate the high-power relay devices 134, 136 in different orientations and the GFCI device 132 in different orientations. The housings 130 are illustrated as having different shapes to accommodate the GFCI device 132 and high-power relay devices 134, 136. For example, FIG. 3 illustrates the high-power relay devices 134, 136 arranged horizontally in-line with the power cable 102 showing the GFCI device 132 above the high-power relay devices 134, 136. FIG. 4 illustrates the high-power relay devices 134, 136 vertically oriented with the GFCI device 132 positioned between the high-power relay devices 134, 136. The components of the circuit protection device 104 may have other orientations in alternative embodiments.

The housing 130 extends between a first end 140 and a second end 142. Optionally, the housing 130 includes openings at the first and second ends 140, 142 defining a cable inlet 144 at the first end 140 and a cable outlet 146 at the second end 142. The power cable 102 extends from the first end 140 of the housing 130 to the first end 110 (shown in FIG. 1) of the power cable 102. In the illustrated embodiment, the power cable 102 extends from the second end 142 of the housing 130 to the second end 112 (shown in FIG. 1) of the power cable 102. In other various embodiments, the second connector 122 may be provided at the second end 142 or the first connector 120 may be provided at the first end 140.

The GFCI device 132 is at least partially housed within the housing 130. Optionally, various components of the GFCI device 132 may be arranged outside of the housing 130, such as remote from the housing 130, such as in a different housing. In the illustrated embodiment, the GFCI device 132 includes a differential transformer 150 configured to sense a current difference on the hot and neutral conductors 114, 116. Optionally, the differential transformer 150 includes an opening 152. The hot and neutral conductors 114, 116 pass through the opening 152 and the differential transformer 150 is configured to sense a current difference on the hot and neutral conductors 114, 116 passing through the differential transformer 150.

In an exemplary embodiment, the GFCI device 132 includes a circuit board 154 (or a plurality of circuit boards 154) having a control circuit 156 for controlling the circuit protection device 104. The circuit board 154 is electrically connected to the differential transformer 150. Signals from the differential transformer 150 may be transmitted to the circuit board 154. For example, signals relating to the current of the hot conductor, the current of the neutral conductor 116, or a signal relating to current difference on the hot and neutral conductors 114, 116 may be transmitted to the circuit board 154.

The circuit board 154 may include the control circuit 156 for monitoring the current of the hot conductor 114 and the neural conductor 116 and/or monitoring for difference in current in the conductors 114, 116. For example, the control circuit 156 of the circuit board 154 may sense voltage from the differential transformer 150. The voltage is created when magnetic fields in the hot and neutral conductors 114, 116 are different. For example, the magnetic fields may be different when current flows from the hot line through the ground conductor 118 instead of through the neutral conductor 116 causing a difference in current in the hot conductor 114 and the neutral conductor 116.

The control circuit 156 may initiate a triggering event, such as when the current difference is sensed and/or exceeds a threshold current difference. The control circuit 156 may cause the circuit protection device 104 to change operation modes of the power cable assembly 100. For example, the control circuit 156 may cause the circuit protection device 104 to enter a safe mode or an off mode where the power transmitted by the power cable assembly 100 is reduced or shut off.

In an exemplary embodiment, the control circuit 156 controls operation of the high-power relay devices 134, 136. For example, the control circuit(s) 156 may be electrically connected to the first high-power relay device 134 and/or electrically connected to the second high-power relay device 136. When the control circuit 156 initiates a triggering event, the high-power relay devices 134, 136 are opened to shut off the flow of power through the circuit protection device 104 and the power cable 102.

In an exemplary embodiment, the power cable assembly 100 includes a hot line 160 and a neutral line 162. The hot line 160 is defined by the hot conductor 114 at the first end 140 entering the cable inlet 144 and terminated to the first high-power relay device 134 and the other hot conductor 114 electrically connected to the first high-power relay device 134 extending out through the cable outlet 146 at the second end 142. The neutral line 162 is defined by the neutral conductor 116 at the first end 140 entering the cable inlet 144 and terminated to the second high-power relay device 136 and the other neutral conductor 116 electrically connected to the second high-power relay device 136 extending out through the cable outlet 146 at the second end 142. As such, the high-power relay devices 134, 136 form parts of the hot line 160 and the neutral line 162, respectively, of the power cable assembly 100.

The high-power relay devices 134, 136 operate as switches to open and close the hot and neutral lines 160, 162. In an exemplary embodiment, the high-power relay devices 134, 136 are contactors used for electrical switching between open and closed states. Optionally, the relay devices 134, 136 may be normally open and then held closed by the GFCI device 132 during operation. For example, the control circuit 156 may supply a drive current to each of the high-power relay devices 134, 136 to close the hot and neutral lines 160, 162 to allow power to flow through the power cable 102. When the triggering event is sensed, the drive current closing the high-power relay devices 134, 136 is switched off causing the high-power relay devices 134, 136 to open. In an exemplary embodiment, the relay devices 134, 136 are capable of handling high currents passing through the power cable 102. The high currents may bypass the GFCI device 132 by having the hot and neutral conductors 114, 116 directly terminated to the relay devices 134, 136. The high current of the power cables 102 does not pass through the circuit board 154 or control circuit 156.

Figure 5:
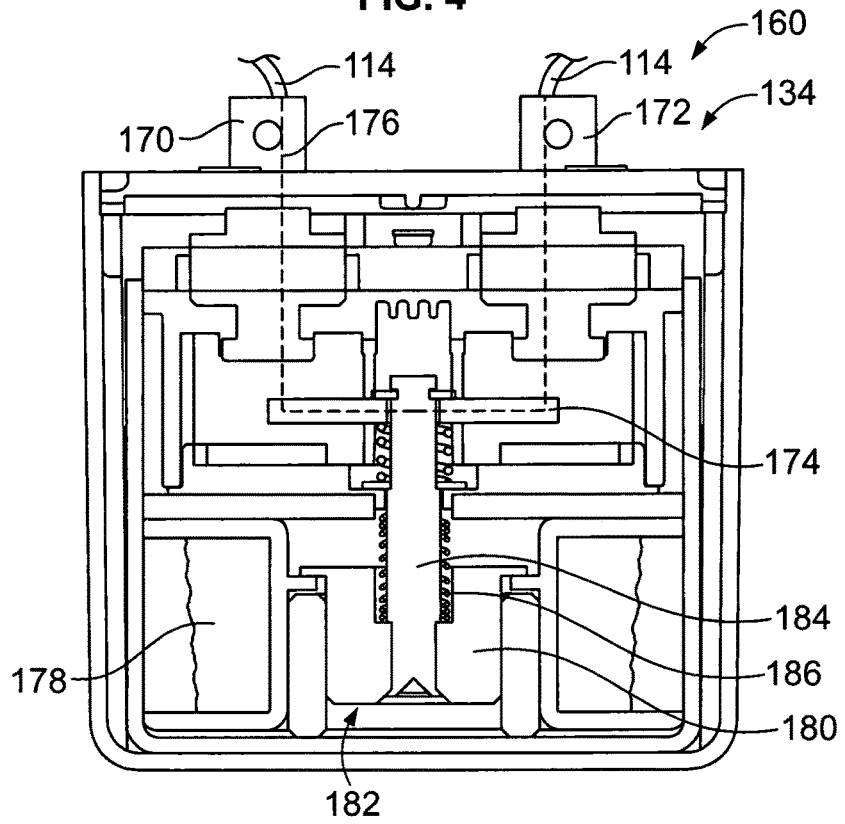
FIG. 5 is a cross-sectional view of a portion of the circuit protection device showing a high-power relay device.

FIG. 5 is a cross-sectional view of a portion of the circuit protection device 104 showing the first high-power relay device 134. Optionally, the second high-power relay device 136 (shown in FIG. 3) may be similar or identical to the first high-power relay device 134 and thus will not be described in further detail.

The high-power relay device 134 includes an input terminal 170, an output terminal 172 and a moveable contact 174 configured to engage and electrically connect the input and output terminals 170, 172 to form a relay circuit 176. The high-power relay device 134 includes a drive coil 178 configured to move the moveable contact 174 to open and close the relay circuit 176. The drive coil 178 is driven based on a control current from the control circuit 156 of the GFCI device 132. In an exemplary embodiment, the high-power relay device 134 includes a plunger 180 moveably received within an opening 182 in the high-power relay device 134. A shaft 184 extends from the plunger 180. The moveable contact 174 is connected to the shaft 184, such as at the end of the shaft 184 opposite the plunger 180. A return spring 186 surrounds the shaft 184 and is coupled to the plunger 180. The return spring 186 pushes downward against the plunger 180 to hold the moveable contact 174 in an open position.

During operation, the drive coil 178 is energized to move the plunger 180 in a closing direction (for example upward as shown in the illustrated embodiment). As the plunger 180 is driven upward, the shaft 184 moves with the plunger 180 to move the moveable contact 174 to a closed position. In the closed position, the moveable contact 174 engages the input terminal 170 and the output terminal 172. An electrical path is created between the input terminal 170 and the output terminal 172 through the moveable contact 174. In an exemplary embodiment, hot conductors 114 are electrically connected to both terminals 170, 172. When the moveable contact 174 is closed, the hot line 160 is closed thus allowing power to flow through the hot line 170.

During operation, when the drive coil 178 is de-energized, such as when a triggering event is sensed and the drive current from the control circuit 156 is shut off, the return spring 186 forces the plunger 180 to move downward to an open position. The moveable contact 174 is disengaged from the terminals 170, 172 to open the hot line 160. Power is unable to flow through the hot line 160 when the high-power relay device 134 is open. As such, the high-power relay device 134 is integrated into the hot line 160 to open and close the hot line 160 based on operation of the GFCI device 132.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power cable assembly comprising:
   a power cable extending between a first end and a second end, the power cable having a hot conductor and a neutral conductor; and
   a circuit protection device along the power cable between the first and second ends, the circuit protection device having a ground fault circuit interrupt (GFCI) device configured to sense a current difference on the hot and neutral conductors to initiate a triggering event, the GFCI device having a control circuit board, the circuit protection device having a first high-power relay device having a first drive coil connected to the control circuit board of the GFCI device and a second high-power relay device having a second drive coil connected to the control circuit board of the GFCI device, the control circuit board operably causing the first and second high-power relay devices to open the hot line and to open the neutral line when the triggering event is initiated by the GFCI device.

2. The power cable assembly of claim 1, wherein the first and second high-power relay devices are normally open, the circuit protection device closing the first and second high-power relay devices during operation of the power cable assembly and allowing the first and second high-power relay devices to open when the triggering event is sensed.

3. The power cable assembly of claim 1, wherein the first and second high-power relay devices and the GFCI device are in line with the power cable.

4. The power cable assembly of claim 1, wherein the first and second high-power relay devices and the GFCI device are contained within a common housing.

5. The power cable assembly of claim 1, wherein the power cable includes a first connector at the first end and a second connector at the second end, the circuit protection device being integrated with one of the first connector or the second connector.

6. The power cable assembly of claim 1, wherein the power cable includes a first connector at the first end and a second connector at the second end, the circuit protection device being housed in a separate housing along the power cable between the first and second connectors.

7. The power cable assembly of claim 1, wherein the power cable includes a charging connector having an electric vehicle charging interface configured to be electrically connected to an electrical vehicle for charging the electric vehicle.

8. The power cable assembly of claim 1, wherein the first high-power relay device is integrated into the hot line to open and close the hot line based on operation of the GFCI device and wherein the second high-power relay device is integrated into the neutral line to open and close the neutral line based on operation of the GFCI device.

9. The power cable assembly of claim 1, wherein the GFCI device includes a differential transformer electrically connected to the control circuit board, the hot conductor and the neutral conductor passing through the differential transformer to sense current difference in the hot and neutral conductors.

10. The power cable assembly of claim 1, wherein the first high-power relay device includes an input terminal, an output terminal, a moveable contact configured to engage and electrically connect the input and output terminals to form a first relay circuit, and the first drive coil configured to move the moveable contact to open and close the first relay circuit, the drive coil being driven based on a control current from the control circuit board of the GFCI device, and wherein the second high-power relay device includes an input terminal, an output terminal, a moveable contact configured to engage and electrically connect the input and output terminals to form a second relay circuit, and the second drive coil configured to move the moveable contact to open and close the second relay circuit, the drive coil being driven based on a control current from the control circuit board of the GFCI device.

11. The power cable assembly of claim 1, wherein the first and second high-power relay devices are contained within a common housing, the housing having a first end and a second end, first high-power relay device provided at the first end of the housing, the second high-power relay device provided at the second end of the housing.

12. The power cable assembly of claim 1, wherein the circuit protection device includes a housing holding the GFCI device and the first and second high-power relay devices, the housing having a cable inlet at a first end of the housing and a cable outlet at a second end of the housing, the power cable extending from the first end of the housing to the first end of the power cable, the power cable extending from the second end of the housing to the second end of the power cable.

13. A power cable assembly comprising:
    a power cable extending between a first end and a second end, the power cable having a hot conductor and a neutral conductor; and
    a circuit protection device along the power cable between the first and second ends, the circuit protection device having a ground fault circuit interrupt (GFCI) device configured to sense a current difference on the hot and neutral conductors to initiate a triggering event, the circuit protection device having a first high-power relay device connected to the GFCI device and a second high-power relay device discrete from the first high-power relay device and connected to the GFCI device, the first high-power relay device being connected to the hot conductor and being configured to open the hot line when the triggering event is initiated by the GFCI device, the second high-power relay device being connected to the neutral conductor and being configured to open the neutral line when the triggering event is initiated by the GFCI device.

14. The power cable assembly of claim 13, wherein the first and second high-power relay devices are normally open, the circuit protection device closing the first and second high-power relay devices during operation of the power cable assembly and allowing the first and second high-power relay devices to open when the triggering event is sensed.

15. The power cable assembly of claim 13, wherein the circuit protection device is in line with the power cable.

16. The power cable assembly of claim 13, wherein the first and second high-power relay devices and the GFCI device are contained within a common housing.

17. The power cable assembly of claim 13, wherein the power cable includes a first connector at the first end and a second connector at the second end, the second connector having an electric vehicle charging interface configured to interface with an electric vehicle for charging the electric vehicle.

18. The power cable assembly of claim 13, wherein the GFCI device includes a differential transformer and a circuit board electrically connected to the differential transformer, the hot conductor and the neutral conductor passing through the differential transformer to sense current difference in the hot and neutral conductors.

19. The power cable assembly of claim 13, wherein the first and second high-power relay devices each includes an input terminal, an output terminal, a moveable contact configured to engage and electrically connect the input and output terminals to form a relay circuit, and a drive coil configured to move the moveable contact to open and close the relay circuit, the drive coil being driven based on a control current from the GFCI device.

20. A power cable assembly comprising:

a power cable extending between a first end and a second end, the power cable having a hot conductor and a neutral conductor; and a circuit protection device along the power cable between the first and second ends, the circuit protection device having a housing attached to the power cable, the housing having an opening receiving the hot conductor and the neutral conductor, the circuit protection device having a ground fault circuit interrupt (GFCI) device in the housing, the GFCI device configured to sense a current difference on the hot and neutral conductors to initiate a triggering event, the GFCI device having a control circuit board, the circuit protection device having a first high-power relay device in the housing, the first high-power relay device connected to the control circuit board of the GFCI device, the first high-power relay device being connected to the hot conductor and being configured to open the hot line when the triggering event is initiated by the GFCI device, the circuit protection device having a second high-power relay device in the housing, the second high-power relay device connected to the control circuit board of the GFCI device, the second high-power relay device being connected to the neutral conductor and being configured to open the neutral line when the triggering event is initiated by the GFCI device.

* * * * *